(12) United States Patent
Yagi

(10) Patent No.: US 7,777,536 B2
(45) Date of Patent: Aug. 17, 2010

(54) SYNCHRONIZATION CIRCUIT

(75) Inventor: Tsukasa Yagi, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 13 days.

(21) Appl. No.: 12/334,702

(22) Filed: Dec. 15, 2008

(65) Prior Publication Data

US 2009/0153202 A1 Jun. 18, 2009

(30) Foreign Application Priority Data

Dec. 18, 2007 (JP) ............... 2007-325889

(51) Int. Cl.
*H03L 7/00* (2006.01)
(52) U.S. Cl. ............. 327/141; 327/144; 375/355; 375/356
(58) Field of Classification Search ............ None
See application file for complete search history.

(56) References Cited

U.S. PATENT DOCUMENTS

| | | | | |
|---|---|---|---|---|
| 4,972,518 A * | 11/1990 | Matsuo | ............ | 326/93 |
| 5,999,023 A * | 12/1999 | Kim | ............ | 327/144 |
| 6,496,555 B1 * | 12/2002 | Soda | ............ | 375/376 |
| 6,614,314 B2 * | 9/2003 | d'Haene et al. | ............ | 331/1 A |
| 6,714,612 B1 * | 3/2004 | Chaudry | ............ | 375/368 |
| 6,959,061 B1 * | 10/2005 | Kuwata | ............ | 375/373 |
| 7,057,418 B1 * | 6/2006 | Fu et al. | ............ | 327/3 |
| 7,373,572 B2 * | 5/2008 | Mak et al. | ............ | 714/729 |
| 7,489,724 B2 * | 2/2009 | Warren | ............ | 375/221 |

FOREIGN PATENT DOCUMENTS

| | | |
|---|---|---|
| JP | 3-81676 | 4/1991 |
| JP | 7-13927 | 1/1995 |

* cited by examiner

*Primary Examiner*—Tuan Lam
(74) *Attorney, Agent, or Firm*—Dickstein Shapiro LLP

(57) ABSTRACT

A synchronization circuit includes a first flip-flop circuit to hold an input signal which is asynchronous to a clock signal by the clock signal, and output an output signal, a second flip-flop circuit to hold the input signal by a signal of an opposite phase to the clock signal and output a signal, a comparing unit to compare the input signal and the output signal of the first flip-flop circuit and output a signal with a high or low level depending on whether the input signal and the output signal of the first flip-flop circuit have the same level, a selection unit to select one of the output signal of the first flip-flop circuit and the output signal of the second flip-flop circuit depending on the level of the signal outputted by the comparing unit, and a third flip-flop circuit to output the output signal selected by the selection unit.

3 Claims, 8 Drawing Sheets

SYNCHRONIZATION CIRCUIT

BACKGROUND OF THE INVENTION

1. Field of the Invention

The present invention relates to a synchronization circuit which synchronizes an asynchronous signal.

2. Description of the Related Art

In recent years, various devices have been required to perform processes at a high speed with less power consumption. Therefore, each module in the device is designed to operate at each optimal speed. Because of this, system clocks of the modules in the device are sometimes asynchronous to each other. When data are sent and received between the modules having system clocks that are asynchronous to each other, a synchronization circuit to synchronize the system clock and input signals is required in the module which receives the input signals.

FIG. 1 is a diagram showing an example of a circuit configuration of a conventional synchronization circuit. A synchronization circuit 10 shown in FIG. 1 is provided in a module which receives data when sending and receiving data between modules. In the synchronization circuit 10, an input signal AD is latched into flip-flop circuits 11 and 12 by a system clock SCK to be synchronized with the system clock SCK.

In the flip-flop circuits 11 and 12, when a rising edge of the system clock SCK is a reference edge, there are a set-up time ts before the reference edge, during which the input signal AD has to be stabilized and a hold time th after the reference edge, during which the input signal AD has to be held. The flip-flop circuits 11 and 12 can properly read in the input signal AD when the stable input signal AD is inputted in the set-up time ts and the input signal AD is held during the hold time th.

For example, when a signal level of the input signal AD inputted from a data input terminal D is not stabilized in the set-up and hold time (ts+th) in the flip-flop circuit 11, an output signal PD of the flip-flop circuit 11 becomes metastable. A metastable state is an unstable state that the output signal is neither at a high level (hereinafter H-level) or a low level (hereinafter L-level). Then, the output signal of the flip-flop circuit 11 is converged to one of the H-level and the L-level. After the metastable state, the output signal is converged to one of the levels completely randomly, regardless of the level of the input signal AD. Therefore, due to the metastable state generated in the flip-flop circuit 11 of a preceding stage, the input signal may not be properly sent to the flip-flop circuit 12 of a subsequent stage.

In view of this, there is disclosed a circuit configuration to properly transmit an input signal even when a metastable state occurs. FIG. 2 shows another example of a circuit configuration of a conventional synchronization circuit.

A synchronization circuit 20 shown in FIG. 2 includes flip-flop circuits 21, 22, and 23, a selection circuit 24, and a logic circuit 25. The flip-flop circuits 21 and 22 operate in synchronization with signals having an opposite phase to each other. The flip-flop circuit 21 operates in synchronization with a system clock SCK while the flip-flop circuit 22 operates in synchronization with an inverted signal of the system clock SCK.

In the synchronization circuit 20, an output signal SYNC1 of the flip-flop circuit 21 of a preceding stage and an output signal SYNC3 of the flip-flop circuit 23 of a subsequent stage to be an output signal of the synchronization circuit 20 are compared to detect whether a metastable state has occurred. Based on the comparison result, one of the output signal SYNC1 of the flip-flop circuit 21 and an output signal SYNC2 of the flip-flop circuit 22 is selected and inputted to the flip-flop circuit 23.

An equivalent circuit configuration to the synchronization circuit shown in FIG. 2 is disclosed in, for example, Patent Document 1.

[Patent Document 1] Japanese Patent Application Publication No. 7-13927

With the synchronization circuit disclosed in Patent Document 1, however, the input signal and the output signal of the flip-flop circuit of the subsequent stage are compared to detect an occurrence of a metastable state. Therefore, when the output signal of the flip-flop circuit of the preceding stage is converged to a level that is different from a level of the input signal after the metastable state, the flip-flop circuit of the subsequent state cannot sometimes receive the proper input signal at a next system clock after a system clock at which the metastable state occurred. Therefore, when an input signal of plural bits is synchronized with the system clock, a time difference of one system clock cycle occurs between the bits, which may cause a malfunction of a module of a subsequent stage.

SUMMARY OF THE INVENTION

It is an object of at least one embodiment of the invention to provide a synchronization circuit in which even when a metastable state occurs, desired input data can be synchronized at a next system clock after a system clock at which the metastable state occurred.

Following configurations are employed to achieve the object of at least one embodiment of the invention.

According to one aspect of the invention, a synchronization circuit includes a first flip-flop circuit configured to hold an input signal, which is asynchronous to a clock signal, by the clock signal and output an output signal, a second flip-flop circuit configured to hold the input signal by a signal of an opposite phase to the clock signal and output a signal, a comparing unit configured to compare the input signal and the output signal of the first flip-flop circuit and output a signal with a high or low level depending on whether the input signal and the output signal of the first flip-flop circuit have the same level, a selection unit configured to select one of the output signal of the first flip-flop circuit and the output signal of the second flip-flop circuit in response to the level of the signal outputted by the comparing unit, and a third flip-flop circuit configured to output the output signal selected by the selection unit.

According to one embodiment of the invention, even when a metastable state occurs, desired input data can be synchronized at a next system clock after a system clock at which the metastable state occurred, without being affected by the metastable state.

DETAILED DESCRIPTION OF THE PREFERRED EMBODIMENTS

A synchronization circuit of the invention includes a first flip-flop circuit to hold an input signal by a system clock and a second flip-flop circuit to hold the input signal by a signal of an opposite phase to the system clock. By comparing the input signal and an output signal of the first flip-flop circuit, occurrence of a metastable state is detected. Based on the detection result, the synchronization circuit inputs one of the output signal of the first flip-flop circuit and an output signal of the second flip-flop circuit to a third flip-flop circuit of a subsequent stage.

First Embodiment

Figure 1:
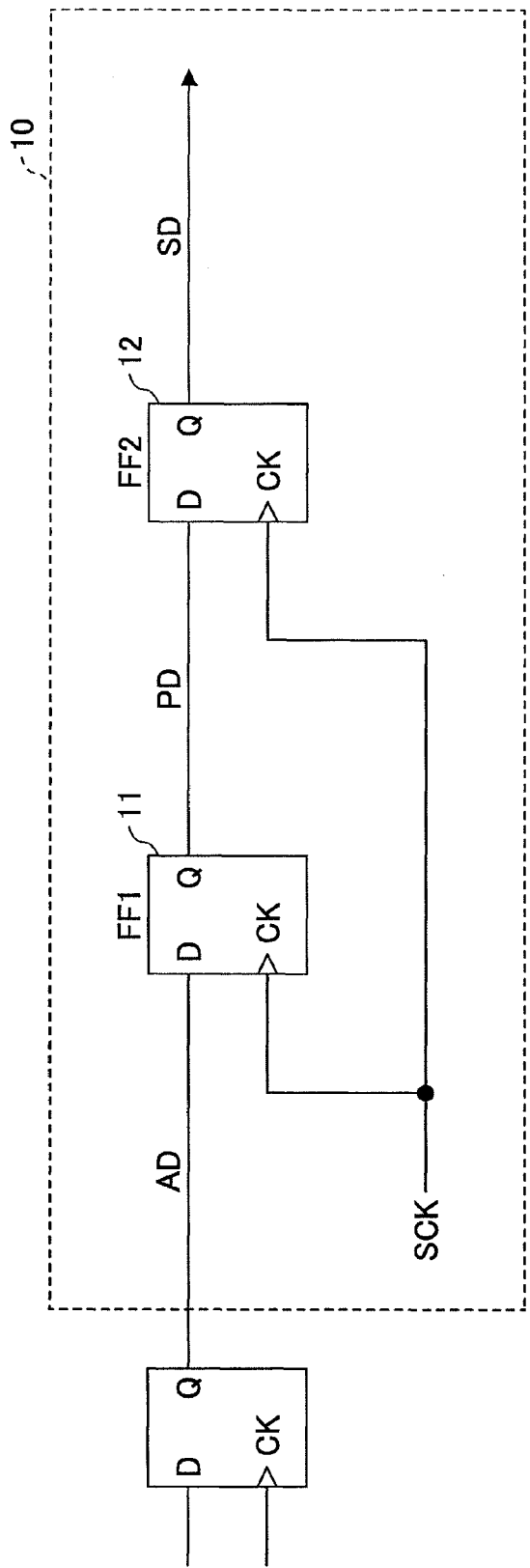
FIG. 1 is a diagram showing an example of a circuit configuration of a conventional synchronization circuit.
Figure 2:
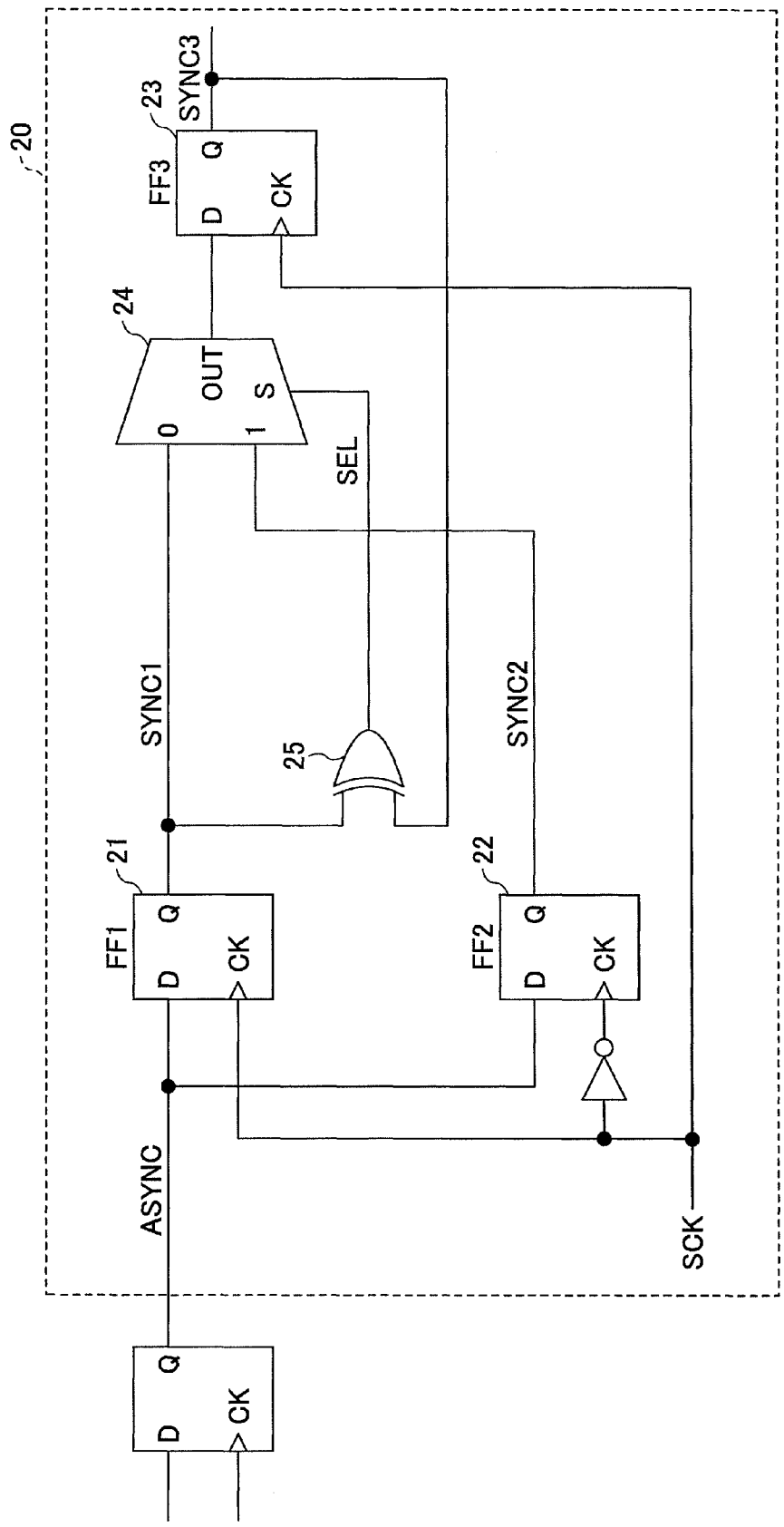
FIG. 2 is a diagram showing another example of a circuit configuration of a conventional synchronization circuit.
Figure 3:
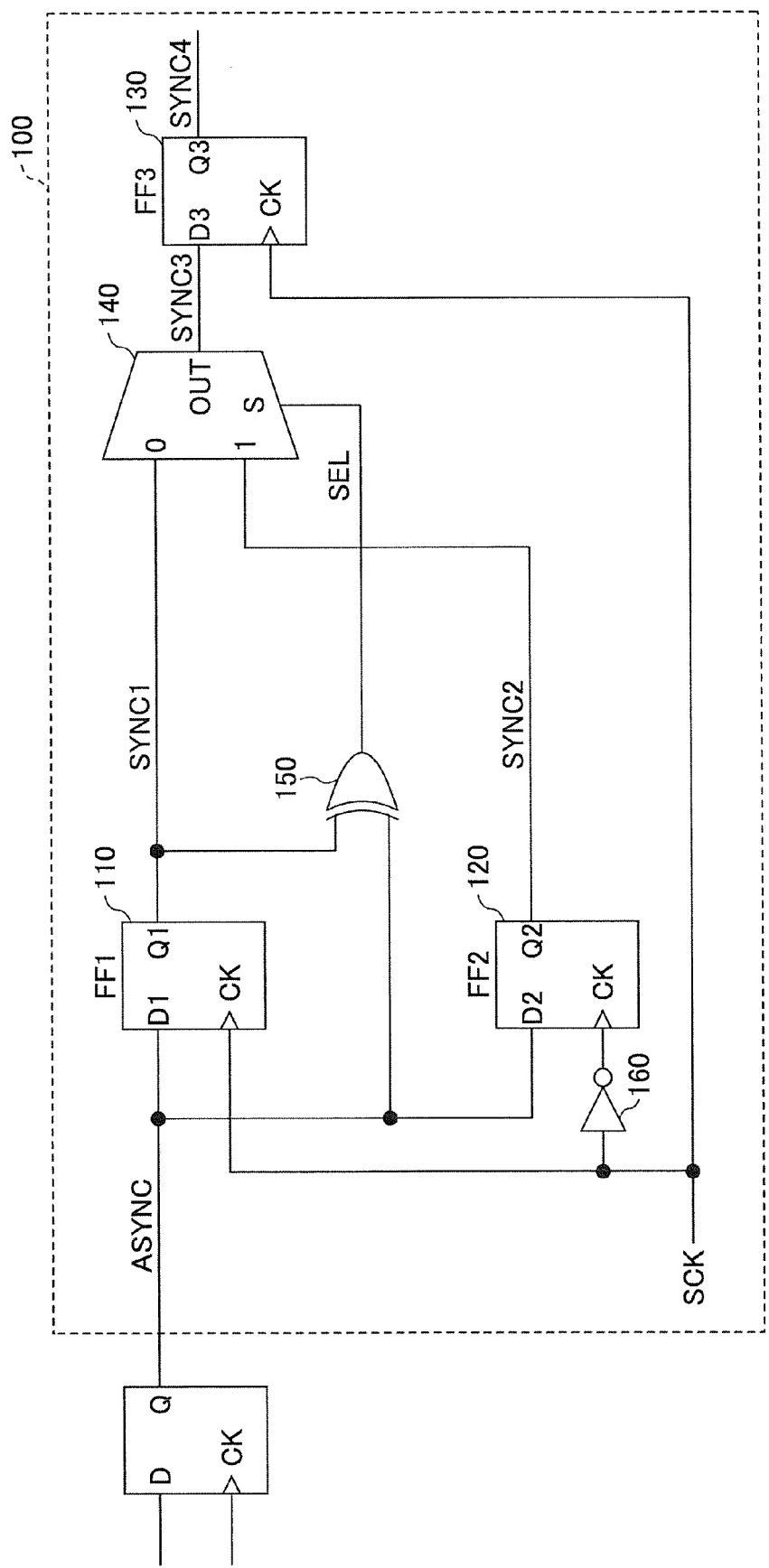
FIG. 3 is a circuit configuration diagram of a synchronization circuit 100 of a first embodiment of the invention.

A first embodiment of the invention is described below with reference to the drawings. FIG. 3 is a circuit configuration diagram showing the synchronization circuit 100 of the first embodiment of the invention.

The synchronization circuit 100 of this embodiment includes flip-flop circuits 110, 120, and 130, a selection circuit 140, an XOR circuit 150, and an inverter 160.

The synchronization circuit 100 of this embodiment synchronizes an input signal inputted to a module having the synchronization circuit 100 and a system clock SCK of the module having the synchronization circuit 100.

The system clock SCK is inputted to clock terminals of the flip-flop circuits 110 and 130. A signal of an opposite phase to the system clock SCK, which is the system clock SCK inverted by an inverter 160, is inputted as a clock signal to a clock terminal of the flip-flop circuit 120.

An input signal ASYNC which is asynchronous to the system clock SCK is inputted to a data terminal D1 of the flip-flop circuit 110 and a data terminal D2 of the flip-flop circuit 120. An output signal SYNC1 outputted from an output terminal Q1 of the flip-flop circuit 110 and an output signal SYNC2 outputted from an output terminal Q2 of the flip-flop circuit 120 are inputted to the selection circuit 140.

The output signal SYNC1 of the flip-flop circuit 110 and the input signal ASYNC are inputted to the XOR circuit 150. An output signal SEL of the XOR circuit 150 is supplied to the selection circuit 140 as a selection signal. An output signal SYNC3 of the selection circuit 140 is inputted to a data terminal D3 of the flip-flop circuit 130. The flip-flop circuit 130 holds the output signal SYNC3 from the selection circuit 140 at a timing of the system clock SCK and outputs the signal as an output signal SYNC4 from an output terminal Q3.

Figure 4:
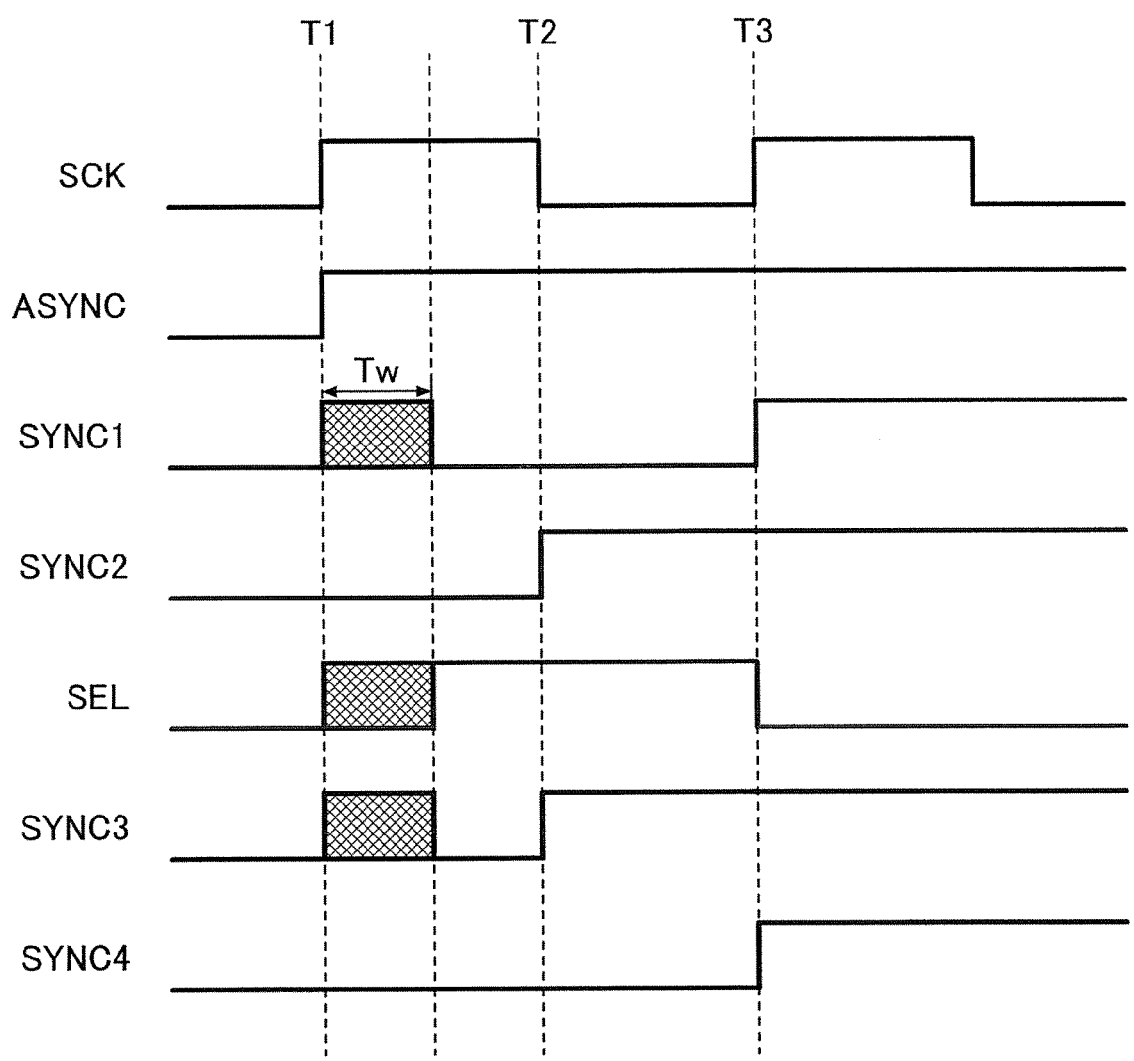
FIG. 4 is a first timing chart for describing an operation of the synchronization circuit 100 of the first embodiment of the invention.

An operation of the synchronization circuit 100 of this embodiment is described below with reference to FIGS. 4 and 5. FIG. 4 is a first timing chart for describing the operation of the synchronization circuit 100 of the first embodiment. FIG. 4 shows the case where the flip-flop circuit 110 enters a metastable state and the output signal SYNC1 of the flip-flop circuit 110 is converged to an L-level.

In the synchronization circuit 100, when the input signal ASYNC changes from an L-level to an H-level during a setup and hold time at a timing of a rising edge T1 of the system clock SCK, the flip-flop 110 enters a metastable state. The output signal SYNC1 of the flip-flop circuit 110 of this embodiment is converged to the L-level after a metastable period Tw.

In the synchronization circuit 100, when the output signal SYNC1 and the input signal ASYNC are not in synchronization with each other when the metastable period Tw has passed, the output signal SEL of the XOR circuit 150 becomes an H-level. When the output signal SYNC1 and the input signal ASYNC are in synchronization with each other when the metastable period Tw has passed, the output signal SEL of the XOR circuit 150 becomes an L-level. That is, the XOR circuit 150 of this embodiment is a comparing unit which compares the input signal ASYNC and the output signal SYNC1 and outputs a signal based on a comparison result of whether the signals are in synchronization with each other.

In the example shown in FIG. 4, the output signal SYNC1 when the metastable period Tw has passed is converged to the L-level after the unstable state. Since the input signal ASYNC is at the H-level, the output signal SEL of the XOR circuit 150 becomes an H-level.

The output signal SEL of the XOR circuit 150 is selected as a selection signal by the selection circuit 140. When an L-level signal is inputted as a selection signal to the selection circuit 140, the selection circuit 140 outputs the output signal SYNC1 of the flip-flop circuit 110 and outputs the output signal SYNC2 of the flip-flop circuit 120 when the H-level signal is inputted as the selection signal. Since the H-level signal is supplied as a selection signal to the selection circuit 140 in FIG. 4, the selection circuit 140 outputs the output signal SYNC2 of the flip-flop circuit 120 as the output signal SYNC3.

The flip-flop circuit 120 receives the input signal ASYNC at a timing of a rising edge of the signal of an opposite phase to the system clock SCK. Thus, the flip-flop circuit 120 receives the input signal ASYNC, which is already determined, at a timing T2 which is a half clock cycle later than a timing at which the flip-flop circuit 110 receives the input signal ASYNC.

Therefore, when the selection circuit 140 selects the output signal SYNC2 of the flip-flop circuit 120 to output as the output signal SYNC3, the flip-flop circuit 130 can receive the output signal SYNC3 at a timing of a rising edge T3 of the system clock SCK. Here, the output signal SYNC3 received in the flip-flop circuit 130 has the same logic state (H-level) as the input signal ASYNC. The flip-flop circuit 130 holds and outputs the output signal SYNC3 as an output signal SYNC4.

Therefore, in the synchronization circuit 100 of this embodiment, even when the flip-flop circuit 110 enters a metastable state at a timing of the rising edge T1, the input signal ASYNC can be transmitted to the flip-flop circuit 130 of a subsequent stage at a timing of the next rising edge T3 of the system clock SCK.

Figure 5:
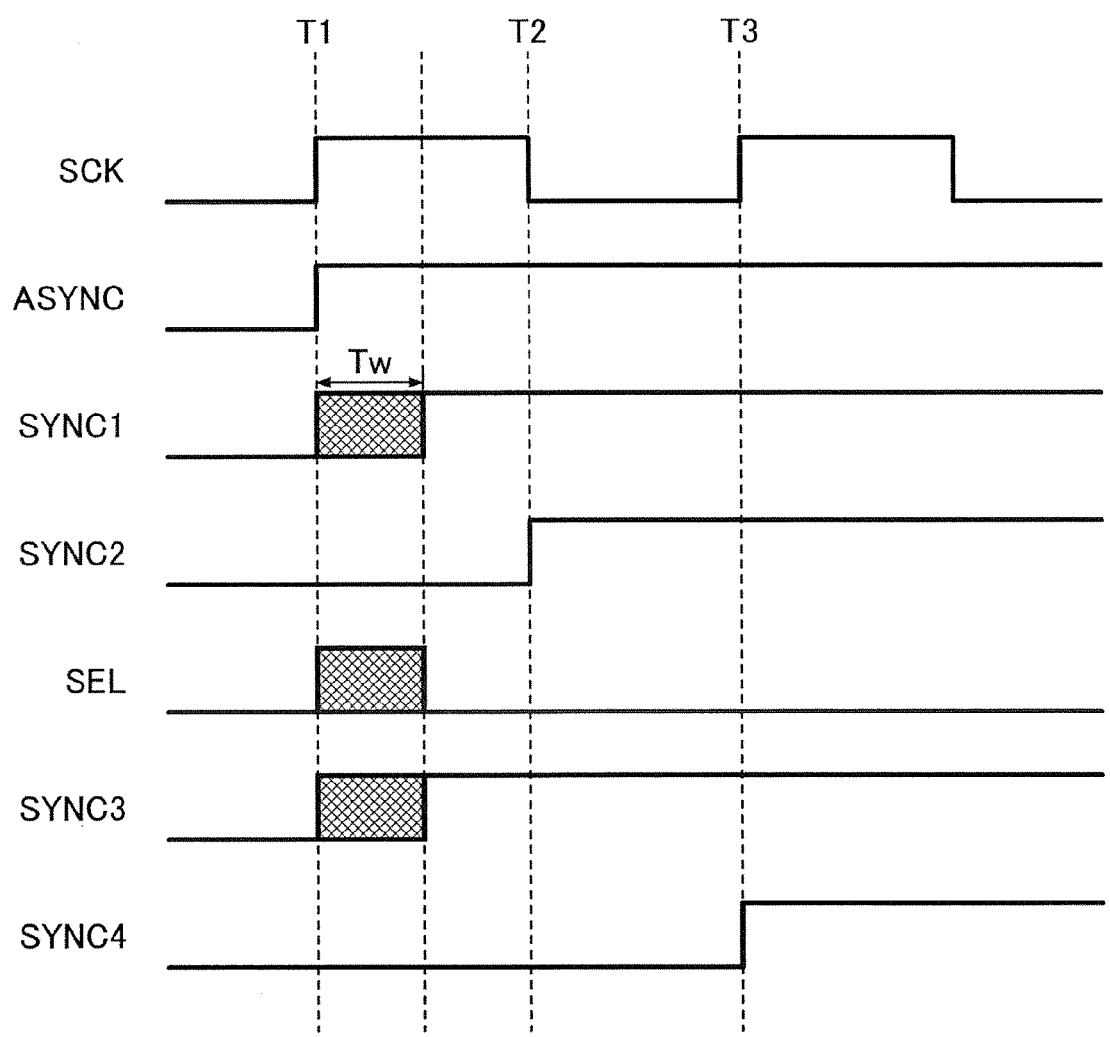
FIG. 5 is a second timing chart for describing an operation of the synchronization circuit 100 of the first embodiment of the invention.

Next, a description is made with reference to FIG. 5 on the case that the output signal SYNC1 is converged to the H-level after the flip-flop circuit 110 enters a metastable state. FIG. 5 is a second timing chart for describing the operation of the synchronization circuit 100 of the first embodiment of the invention.

In the synchronization circuit 100, when the flip-flop circuit 110 enters a metastable state at the rising edge T1 of the system clock SCK, the output signal SYNC1 of the flip-flop circuit 110 is converged to the H-level after an unstable state of a metastable period Tw.

Since the input signal ASYNC inputted to the XOR circuit 150 is at the H-level, the input signal ASYNC and the output signal SYNC1 are in synchronization with each other. Thus, the output signal SEL of the XOR circuit 150 becomes an L-level. When a selection signal at the L-level is inputted to the selection circuit 140, the selection circuit 140 selects and outputs the output signal SYNC1 of the flip-flop circuit 110. Therefore, the output signal SYNC1 is outputted as the output signal SYNC3 of the selection circuit 140. Note that the output signal SYNC1 is the same signal as the input signal ASYNC and has the same logic state (H-level) as the input signal ASYNC. The flip-flop circuit 130 holds the output signal SYNC3 outputted from the selection circuit 140 and outputs an output signal SYNC4.

In this manner, the flip-flop circuit 130 can receive the output signal SYNC3 (output signal SYNC1) which is the same as the input signal ASYNC, at the next rising edge T3 after the rising edge T1. Therefore, even when the flip-flop circuit 110 enters a metastable state at a timing of the rising edge T1 in the synchronization circuit 100 of this embodiment, the input signal ASYNC can be transmitted to the flip-flop circuit 130 of the subsequent stage at a timing of the next rising edge T3 of the system clock SCK.

In this manner, the input signal ASYNC and the output signal SYNC1 of the flip-flop circuit 110 are compared to detect occurrence of a metastable state in the synchronization circuit 100 of this embodiment. When a metastable state occurs, a signal to be transmitted to the subsequent stage is selected from the output signal SYNC1 and the output signal SYNC2 based on a signal level to which the output signal SYNC1 is converged.

Therefore, in the synchronization circuit 100 of this embodiment, the input signal ASYNC can be transmitted to the subsequent stage without causing a time difference even when a metastable state occurs. As a result, even when an asynchronous signal of plural bits is to be synchronized, a malfunction of the system caused by the time difference of synchronization timings between the bits can be prevented.

Second Embodiment

Hereinafter, a second embodiment of the invention is described with reference to the drawings. The second embodiment of the invention is different from the first embodiment in that a latch circuit 170 is provided between the selection circuit 140 and the XOR circuit 150 serving as the synchronization circuit of the first embodiment. Therefore, components with similar functions to those in the first embodiment are denoted by the same reference numerals as those in the first embodiment, and description thereof will be omitted.

Figure 6:
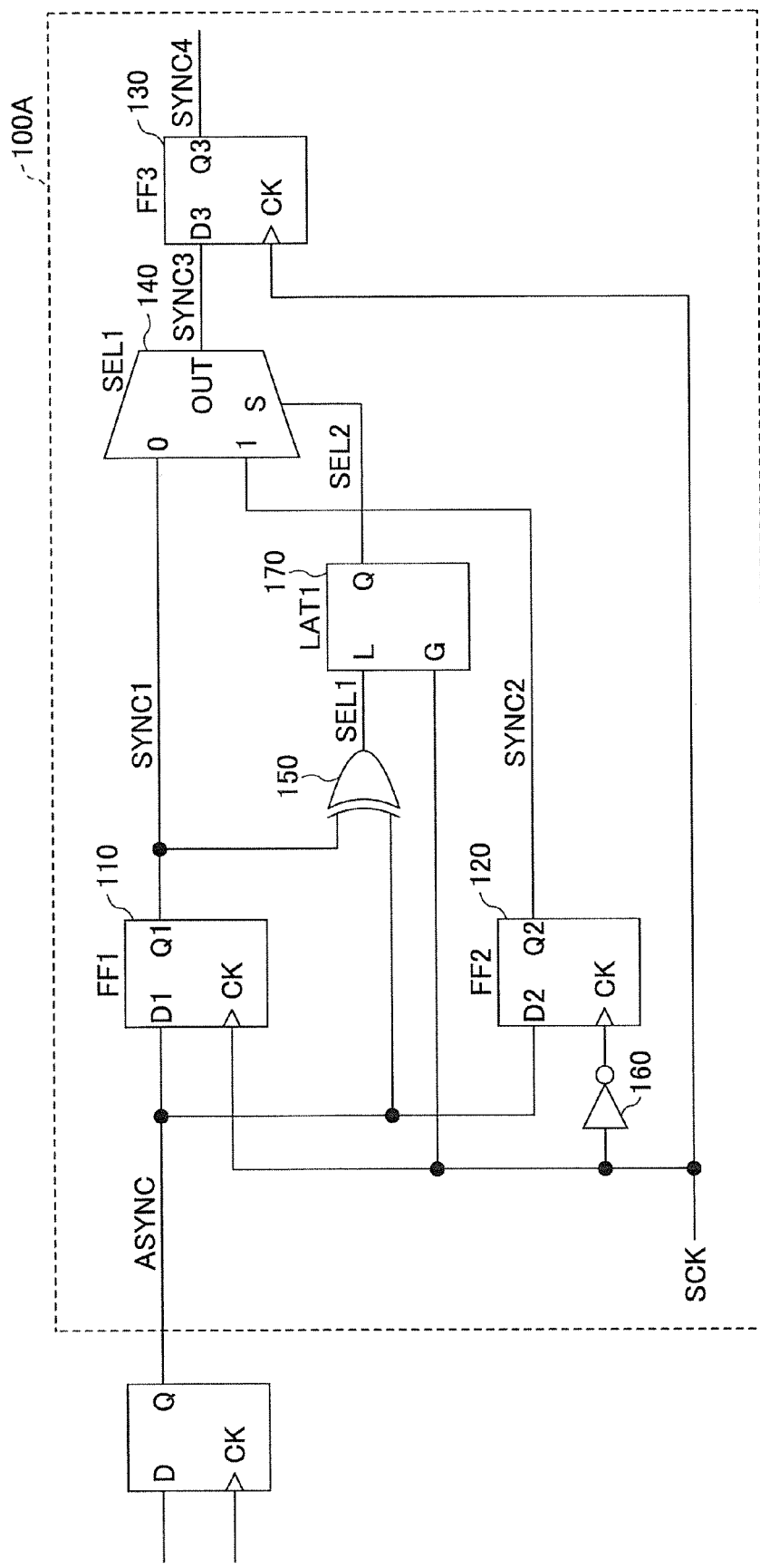
FIG. 6 is a circuit configuration diagram of a synchronization circuit 100A of a second embodiment of the invention.

FIG. 6 is a circuit configuration diagram of a synchronization circuit 100A of the second embodiment of the invention. The synchronization circuit 100A of this embodiment includes the latch circuit 170 to which the system clock SCK and an output signal SELL of the XOR circuit 150 are inputted. An output signal SEL2 of the latch circuit 170 is supplied as a selection signal to the selection circuit 140.

Figure 7:
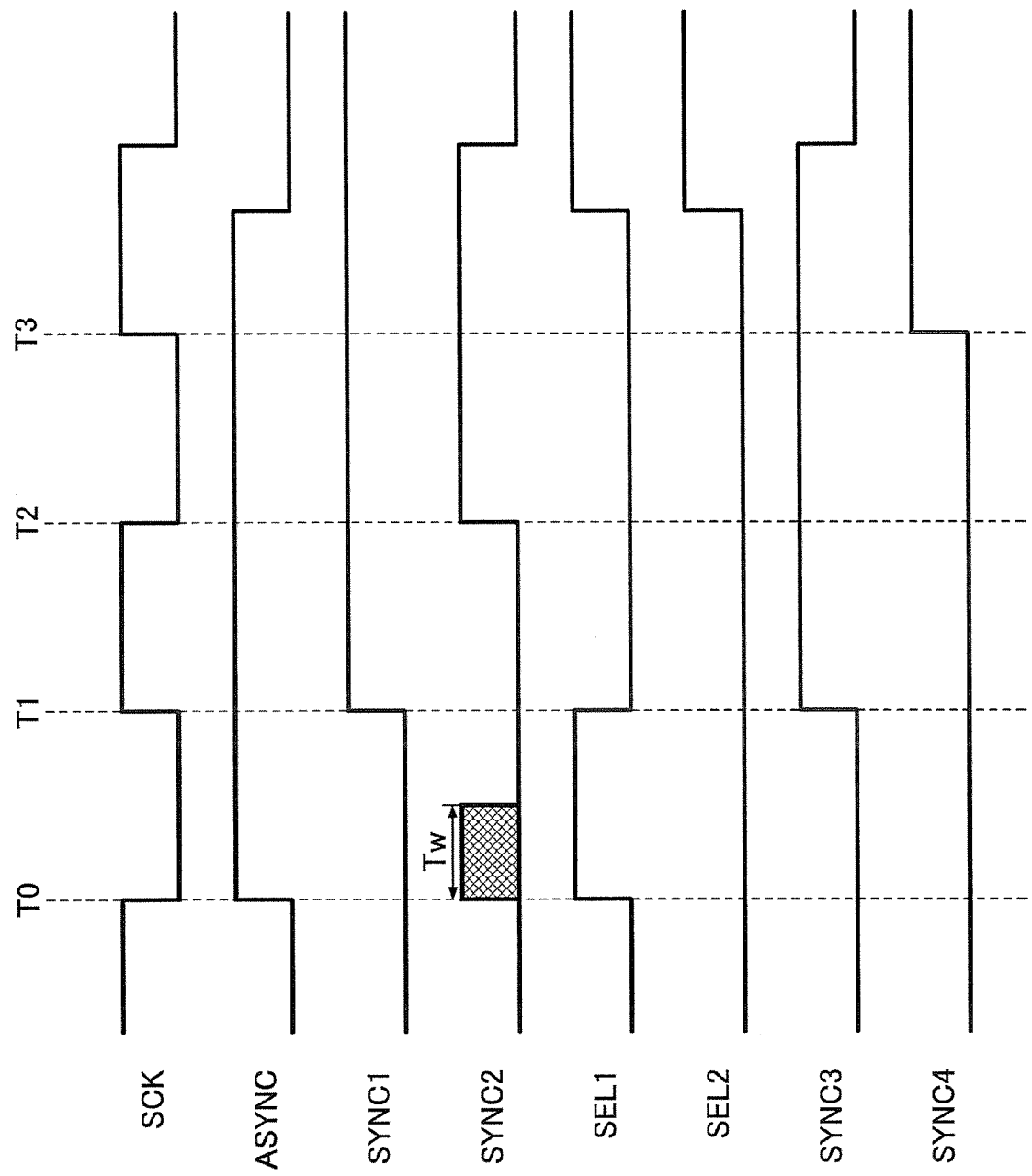
FIG. 7 is a first timing chart for describing an operation of the synchronization circuit 100A of the second embodiment of the invention.
Figure 8:
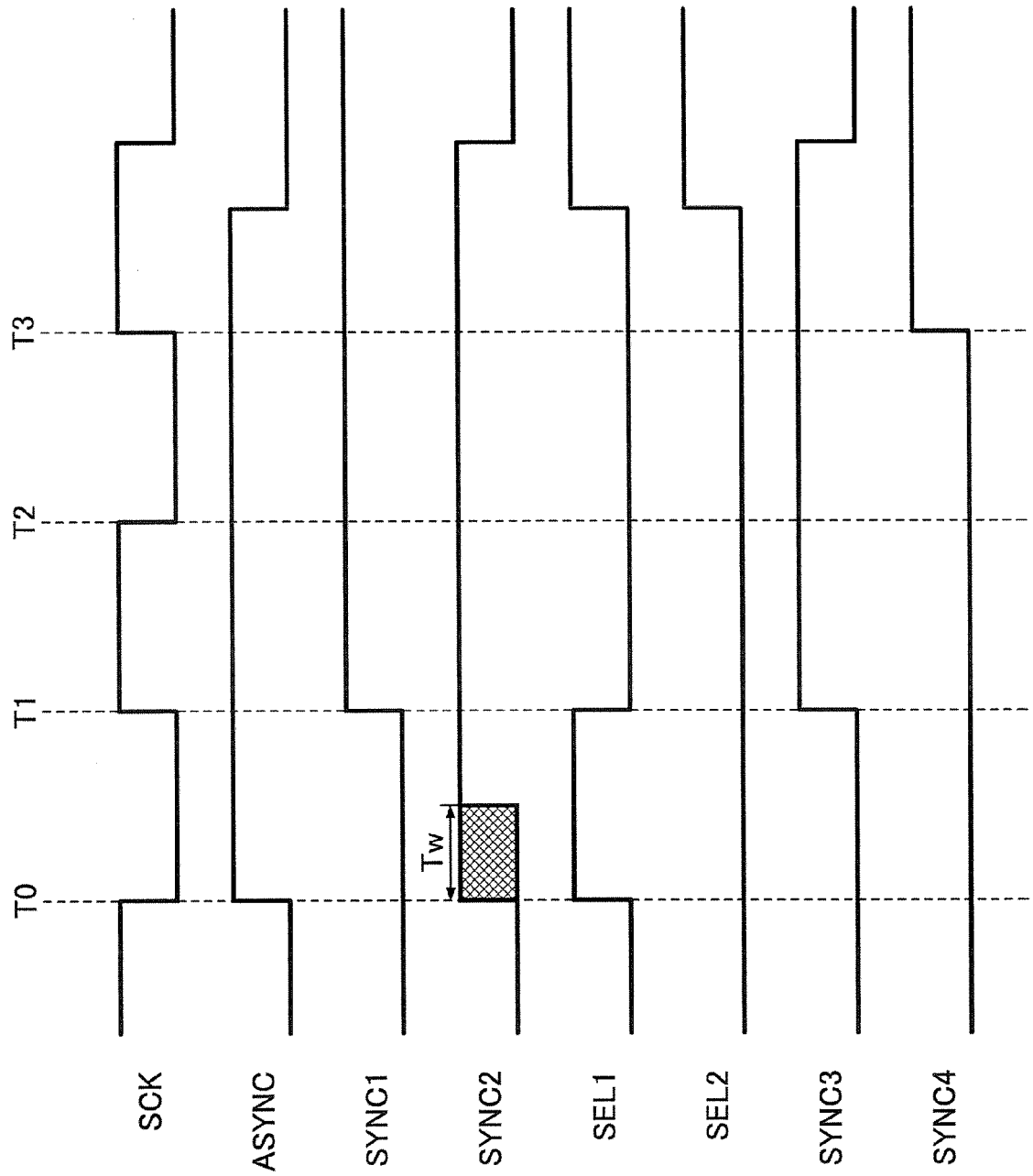
FIG. 8 is a second timing chart for describing an operation of the synchronization circuit 100A of the second embodiment of the invention.

Next, an operation of the synchronization circuit 100A of this embodiment is described with reference to FIGS. 7 and 8. FIG. 7 is a first timing chart for describing the operation of the synchronization circuit 100A of the second embodiment. In FIG. 7, after the flip-flop circuit 120 enters a metastable state at a timing of a falling edge T0 of the system clock SCK, the output signal SYNC2 of the flip-flop circuit 120 is converged to the L-level in the synchronization circuit 100A.

Even when the flip-flop circuit 120 enters the metastable state in this embodiment, the flip-flop circuit 110 holds and outputs the input signal ASYNC. Therefore, the output signal SYNC1 of the flip-flop circuit 110 becomes synchronized with the input signal ASYNC at a rising edge T1 at which the flip-flop circuit 110 receives and outputs the input signal ASYNC. When the input signal ASYNC and the output signal SYNC1 are synchronized with each other, the output signal SEL1 of the XOR circuit 150 becomes an L-level.

At this time, since the latch circuit 170 holds the logic state of the output signal SELL right before the system clock SCK becomes an L-level, the output signal SEL2 of the latch circuit 170 remains at the L-level. Therefore, the output signal SEL2 at the L-level is supplied as a selection signal to the selection circuit 140.

Receiving the L-level selection signal, the selection circuit 140 selects and outputs the output signal SYNC1 as the output signal SYNC3. At this time, the output signal SYNC3 is outputted at a timing of the rising edge T1 of the system clock SCK. The flip-flop circuit 130 holds the output signal SYNC3 and outputs the signal as the output signal SYNC4 at a timing of rising edge T3 of the system clock.

In this manner, even when the flip-flop circuit 120 enters a metastable state at a timing of a falling edge of the system clock SCK, the input signal ASYNC can be transmitted to the flip-flop circuit 130 of the subsequent stage at a timing of the next rising edge of the system clock SCK.

Subsequently, a description is made with reference to FIG. 8 on the case that the output signal SYNC2 of the flip-flop circuit 120 is converged to the H-level after the flip-flop circuit 120 enters a metastable state at a timing of the falling edge T0 of the system clock SCK. FIG. 8 is a second timing chart for describing the operation of the synchronization circuit 100A of the second embodiment.

In this embodiment, when the flip-flop circuit 120 enters a metastable state and the output signal SYNC2 is converged to the L-level, the output signal SEL2 of the latch circuit 170 remains at the L-level. Therefore, the selection circuit 140 selects the output signal SYNC1 of the flip-flop circuit 110 and outputs the output signal SYNC3, which has the same logic state as the output signal SYNC1, to the flip-flop circuit 130. That is, in this embodiment, the input signal ASYNC can be transmitted to the flip-flop circuit 130 of the subsequent stage at a timing of the next rising edge T1 of the system clock SCK.

In the second embodiment, as described above, even when the flip-flop circuit 120 of the preceding stage enters a metastable state, the input signal ASYNC can be transmitted to the flip-flop circuit 130 of the subsequent stage at a timing of the next rising edge T1 of the system clock SCK. Therefore, according to this embodiment, desired input data can be synchronized at a next system clock without being affected by a metastable state.

Although the invention has been described with respect to specific embodiments for a complete and clear disclosure, the appended claims are not to be thus limited but are to be construed as embodying all modifications and alternative constructions that may occur to one skilled in the art that fairly fall within the basic teachings herein set forth.

This patent application is based on Japanese Priority Patent Application No. 2007-325889 filed on Dec. 18, 2007, the entire contents of which are hereby incorporated herein by reference.

What is claimed is:

1. A synchronization circuit comprising:
a first flip-flop circuit configured to hold an input signal which is asynchronous to a timing of a clock signal at the timing of the clock signal, and output an output signal;
a second flip-flop circuit configured to hold the input signal at a timing of a signal of an opposite phase to the clock signal and output a signal;
a comparing unit configured to compare the input signal and the output signal of the first flip-flop circuit and output a signal with a high or low level depending on whether the input signal and the output signal of the first flip-flop circuit have the same level;
a selection unit configured to select one of the output signal of the first flip-flop circuit and the output signal of the second flip-flop circuit in response to the level of the signal outputted by the comparing unit; and
a third flip-flop circuit configured to output the output signal selected by the selection unit.

2. The synchronization circuit as claimed in claim 1, further comprising a holding unit configured to hold the signal outputted by the comparing unit and output an output signal, wherein the selection unit selects one of the output signal of the first flip-flop circuit and the output signal of the second flip-flop circuit in response to a level of the signal outputted by the holding unit.

3. The synchronization circuit as claimed in claim 1, wherein the comparing unit is an XOR circuit.

* * * * *